(12) United States Patent
Nagai et al.

(10) Patent No.: US 7,923,115 B2
(45) Date of Patent: Apr. 12, 2011

(54) SUBSTRATE WITH FILM AND GLASS FOR FORMATION FILM

(75) Inventors: Kensuke Nagai, Tokyo (JP); Kei Maeda, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 105 days.

(21) Appl. No.: 12/035,204

(22) Filed: Feb. 21, 2008

(65) Prior Publication Data

US 2008/0226900 A1 Sep. 18, 2008

Related U.S. Application Data

(63) Continuation of application No. PCT/JP2006/316027, filed on Aug. 14, 2006.

(30) Foreign Application Priority Data

Aug. 25, 2005 (JP) ................................. 2005-244332
Sep. 12, 2005 (JP) ................................. 2005-263774

(51) Int. Cl.
*B32B 17/06* (2006.01)
*B32B 9/00* (2006.01)
*B32B 9/04* (2006.01)

(52) U.S. Cl. .......................... 428/426; 428/688; 428/704

(58) Field of Classification Search ........................ None
See application file for complete search history.

(56) References Cited

U.S. PATENT DOCUMENTS

| 3,607,388 | A | * | 9/1971 | Hori et al. | ........................ 427/74 |
| 4,314,031 | A | | 2/1982 | Sanford et al. | |
| 5,043,369 | A | * | 8/1991 | Bahn et al. | ..................... 523/466 |
| 5,681,666 | A | | 10/1997 | Treger et al. | |

FOREIGN PATENT DOCUMENTS

| JP | 51-136288 | 11/1976 |
| JP | 57-27941 | 2/1982 |
| JP | 60-49936 | 3/1985 |
| JP | 5-41281 | 2/1993 |
| JP | 5-182759 | 7/1993 |
| JP | 2003-335820 | 11/2003 |
| JP | 2003-340955 | 12/2003 |
| JP | 2003-340971 | 12/2003 |
| JP | 2004-119138 | 4/2004 |
| JP | 2005-119148 | 5/2005 |
| WO | WO 00/36665 | 6/2000 |
| WO | WO 03/094256 A2 | 11/2003 |
| WO | WO 2004/017137 | 2/2004 |
| WO | WO 2007/021627 A1 | 2/2007 |

OTHER PUBLICATIONS

M. Benmalek, et al., "Inorganic coatings on polymers", Surface and Coatings Technology, 76-77, 1995, pp. 821-826.
Yoji Kawamoto, et al., "Glass-Forming Regions and Structure of Glasses in the system Ge-S", Journal of The American Ceramic Society, vol. 52, No. 11, 1969, pp. 626-627.
Andreas Weber, et al., "Thin Glass-Polymer Systems as Flexible Substrates for Displays", SID 02 Digest, 2002, pp. 53-55.
G. Nisato, et al., "Evaluating High Performance Diffusion Barriers: the Calcium Test", Asia Display/IDW '01 Proceedings, 2001, pp. 1435-1438.
J. Eneva, et al., "The fabrication of microrelief structures in evaporated Ag/a-$Ge_{30}$ $S_{70}$ layers", Journal of Materials Science: Materials in Electronics, vol. 10, No. 7, XP002530004, Sep. 1999, pp. 529-531.

* cited by examiner

*Primary Examiner* — Sheeba Ahmed
(74) *Attorney, Agent, or Firm* — Oblon, Spivak, McClelland, Maier & Neustadt, L.L.P.

(57) ABSTRACT

A substrate with film and a glass for forming such a film are provided, wherein the film has high gas barrier property, high transmittance in visible light region, and high productivity since the film provides effective gas barrier property even if the film is a single layer.
A substrate with film having an inorganic amorphous film having a softening temperature of from 100 to 800° C. formed on at least one surface of a substrate; or a substrate with film having an inorganic amorphous film having a glass transition temperature of from 50 to 500° C. formed on at least one surface of a substrate. Further, a glass for forming film composed of a borate glass containing $B_2O_3$ as the main component, a phosphate glass containing $P_2O_5$, a tellurite type composition containing $TeO_2$ as the main component, a bismuth oxide type composition containing $Bi_2O_3$ as the main component or a chalcogenide type composition containing at least one type of element selected from the group consisting of S, Se and Te.

20 Claims, 8 Drawing Sheets

SUBSTRATE WITH FILM AND GLASS FOR FORMATION FILM

TECHNICAL FIELD

The present invention relates to a substrate coated with a film made of a glass having low softening point that is mainly applicable to a display device such as a liquid crystal display element or an organic EL, and to a glass for forming such a film.

BACKGROUND ART

Heretofore, as substrates for a displays such as liquid crystal display elements or organic ELs, it has been attempted to employ a various types of film substrates for the reasons that their shapes can be easily changed, they enable displays in a curved plane and these substrates are light in weight (refer to e.g. Patent Document 1 or 3).

However, such a film substrate has a problem that it was inferior to a glass in gas barrier property. In order to use a film substrate as a substrate for a display such as a liquid crystal display device or an organic EL, it is necessary for the film substrate to have high gas barrier property to prevent deterioration of the device. Particularly in order to use a film substrate for organic EL, the film substrate is required to have a water vapor permeability of at most $5 \times 10^{-5}$ g/m$^2$/day that is a strict requirement not comparable to those for packing members. Conventional gas permeability measurement apparatuses can perform quantitative evaluation of only as low as $5 \times 10^{-3}$ g/m$^2$/day. To cope with this problem, a new gas permeability measurement method using property change of metal Ca is proposed in Non-Patent Document 4.

As a substrate having gas barrier property, a film substrate provided with a specific resin (refer to e.g. Patent Document 1), and a film substrate provided with a resin layer composed of a fluorine compound (refer to e.g. Patent Document 3) are disclosed. However, these substrates do not have sufficient gas barrier properties.

Further, a multilayer gas barrier film constituted by alternately laminated inorganic compound films and resin films 1 inserted between the organic compound films, is proposed (refer to e.g. Patent Document 5). However, since defects such as pinholes formed in a first layer affect the next layer, it is difficult to reduce defect density that significantly affects gas barrier property. Further, there is also a problem that sideward gas barrier property at edges of the film is not sufficient.

Besides this multilayer film, a film substrate provided with a multilayer film made of an inorganic compound such as silicon nitride oxide or silicon nitride, is disclosed (refer to e.g. Patent Document 6). However, since it is necessary to form the multilayer film made of several types of inorganic compound by several types of film-forming methods, there is a problem that the film forming speed is low and the productivity is low.

Further, in recent years a new display device has been being looked forward, which replaces conventional display devices such as CRTs. Among these, especially, an organic EL display has a merit that it realizes high intensity emission even at an applied voltage of less than 10 V, it enables light emission with a simple element structure, and it realizes a display of smaller thickness even compared with a liquid crystal display element. Accordingly, such an organic EL display is expected to be used for such applications as a display for advertisement which emits light of a predetermined pattern, a simple display of low cost or a full color display.

An organic EL element has a construction that an anode, a hole injection layer, a hole transportation layer, a light emission layer and a cathode are laminated in this order, and is usually formed on a transparent substrate. In such an organic EL element, materials of the organic light emission layer or the cathode are deteriorated by moisture or oxygen in the atmospheric air, and accordingly, deterioration of light intensity or generation of defects such as dark spots are pointed as problems. Accordingly in order to prevent deterioration of such an element, it is necessary to seal the element with high gas barrier performance. Especially in order to use a member as a sealing substrate for an organic EL display, the member is required to have a water vapor permeability of $5 \times 10^{-5}$ g/m$^2$/day in terms of permeability to the inside of the sealing substrate, that is a strict requirement not comparable to those of packing members.

In an organic EL display of bottom emission type having a light output plane on a transparent substrate side, as a method for preventing deterioration of performance due to moisture or oxygen, a method of sealing a drying agent in the device by a sealing cap made of a metal or a glass, is disclosed (refer to e.g. Patent Document 7). Further, it is disclosed that such a drying agent is preferably an inert liquid constituted by a fluorocarbon oil mixed with a dehydrating agent such as a synthetic zeolite (refer to e.g. Patent Document 8). However, in each of these methods, sealing step is complicated and productivity is poor. Further, there is a problem that since a sealing substrate itself is thick, the thickness of display is increased. For these reasons, in order to overcome these problems, besides a method of absorbing moisture entered into an element, a sealing capable of preventing intrusion of moisture is looked forward.

As an invention of such a sealing, a sealing achieved by a special resin provided on a transparent substrate (refer to e.g. Patent Document 1) and a sealing achieved by a resin composed of a fluorine compound provided on a transparent substrate (refer to e.g. Patent Document 3) are disclosed. However, these sealings do not provide sufficient gas barrier property.

Further, as another invention, a sealing achieved by a special inorganic compound film formed on a substrate, specifically, by a film composed of alumina or silicon nitride, is proposed. However, since each of these films usually has a small film thickness of tens of nms, and it is difficult to form a dense film, there is a problem that it is difficult to avoid generation of pinholes by a single layer.

In order to compensate this demerit, a multilayer film is proposed, which has a construction that inorganic compound films and resin films inserted between the inorganic compound films are alternately laminated (refer to e.g. Patent Document 5). However, an inorganic compound film has a problem that defects such as pinholes tend to be formed in such a film, and e.g. these pinholes significantly affect gas barrier property of the next layer, and accordingly, it is difficult to reduce defect density. Further, there is also problem that its productivity is poor.

Besides the above films, a multilayer film constituted by a lamination of inorganic compound films of e.g. silicon nitride oxide or silicon nitride, is disclosed (refer to e.g. Patent Document 6). However, this multilayer film does not have sufficient gas barrier performance. Further, since the process for forming such a multilayer film is complicated and its productivity is low, its cost tends to be high. Further, there is also a problem that film-forming speeds of these inorganic compound films are low and their productivities are poor. Further, it is necessary to sequentially laminate several layers to form a multilayer film. In a case of forming a multilayer film on an organic EL element, layers are formed on an upper surface of the element and there will be no problem on the upper surface, but it is difficult to regularly form layers on side portions of such an organic EL element, and there is a problem that gas barrier property on side portions is insufficient.

Patent Document 1: JP-A-2003-335820
Patent Document 2: WO03/094256
Patent Document 3: JP-A-2003-340955
Patent Document 4: JP-A-2003-340971
Patent Document 5: WO00/36665
Patent Document 6: JP-A-2004-119138
Patent Document 7: JP-A-5-182759
Patent Document 8: JP-A-5-41281

Non-Patent Document 1: M. Benmalek, H. M. Dunlop, "Inorganic coatings on polymers", Surface and Coatings Technology 76-77, (1995), pp 821-826.

Non-Patent Document 2: Yoji Kawamoto, Shoji Tsuchihashi, "Glass-Forming Regions and Structure of Glasses in the System Ge-S" J. of The American Ceramic Society vol. 52, No. 11, (1969), pp 626-627.

Non-Patent Document 3: Andreas Weber, Silke Deutschbein, Armin Plichta, "Thin Glass-Polymer Systems as Flexible Substrates for Displays", SID 02 Digest, (2002), pp 53-55.

Non-Patent Document 4: G. Nisato, P. C. P Bouten, P. J. Slikkerveer, W. D. Bennet, G. L. Graff, N. Rutherford, L. Wiese, "Evaluating High Performance Diffusion Barriers: the Calcium Test", Asia Display/IDW '01 Proceedings, (2001), pp 1435-1438.

DISCLOSURE OF THE INVENTION

Problems to be Solved by the Invention

It is an object of the present invention to provide a substrate with film having high gas barrier property, having high transmittance in a visible light region, and having high productivity since an effective gas barrier property is obtainable by a single layer, and to provide a film-forming glass for forming such a film. Further, it is also an object of the present invention to provide a substrate with film having weather resistance and a film-forming glass for forming such a film.

Means for Solving the Problems

The present invention provides the following contents.
(1) A substrate with film comprising a substrate and an inorganic amorphous film provided on at least one surface of the substrate and having a softening temperature of from 100 to 800° C.
(2) A substrate with film comprising a substrate and an inorganic amorphous film provided on at least one surface of the substrate and having a glass transition temperature of from 50 to 500° C.
(3) The substrate with film according to the above (1) or (2), wherein the inorganic amorphous film is formed via a vapor phase.
(4) The substrate with film according to the above (3), wherein every component constituting the inorganic amorphous film has a vapor pressure of at least $1 \times 10^{-7}$ atm ($1 \times 10^{-2}$ Pa) at 1,600° C.
(5) The substrate with film according to any one of the above (1) to (4), which has a minimum transmittance of at least 65% in a wavelength region of 400 to 700 nm.
(6) The substrate with film according to any one of the above (1) to (5), wherein the film thickness of the inorganic amorphous film is from 0.1 to 5 μm.
(7) The substrate with film according to any one of the above (1) to (6), wherein the material of the inorganic amorphous film is a chalcogenide type composition containing at least one type of element selected from the group consisting of S, Se and Te.
(8) The substrate with film according to the above (7), wherein the chalcogenide type composition is a GeS type composition, and the GeS type composition film contains from 5 to 40 mol % of Ge and from 60 to 95 mol % of S.
(9) The substrate with film according to any one of the above (1) to (6), wherein the material of the inorganic amorphous film is a phosphate glass containing $P_2O_5$.
(10) The substrate with film according to the above (9), wherein the content of $P_2O_5$ is from 5 to 39 mol % in the inorganic amorphous film.
(11) The substrate with film according to the above (9) or (10), wherein the phosphate glass further contains a fluoride.
(12) The substrate with film according to the above (10) or (11), wherein the content of the fluoride in the inorganic amorphous film is from 1 to 70 mol %.
(13) The substrate with film according to the above (11) or (12), wherein the fluoride is $SnF_2$.
(14) The substrate with film according to any one of the above (9) to (13), wherein the phosphate glass further contains SnO.
(15) The substrate with film according to the above (14), wherein the content of the SnO in the inorganic amorphous film is from 1 to 80 mol %.
(16) The substrate with film according to any one of the above (1) to (15), wherein the inorganic amorphous film has a gas barrier property.
(17) The substrate with film according to any one of the above (1) to (16), wherein the substrate with film is a sealing substrate.
(18) A glass for forming a film, composed of a borate glass containing $B_2O_3$ as the main component, a phosphate glass containing $P_2O_5$, a tellurite type composition containing $TeO_2$ as the main component, a bismuth oxide type composition containing $Bi_2O_3$ as the main component or a chalcogenide type composition containing at least one type of element selected from the group consisting of S, Se and Te.
(19) The glass for forming a film, according to the above is (18), wherein the phosphate glass further contains a fluoride.
(20) The glass for forming a film, according to the above (18) or (19), wherein the phosphate glass further contains SnO.

EFFECTS OF THE INVENTION

The substrate with film of the present invention employs an inorganic amorphous film having a glass transition temperature of from 50 to 500° C. or a softening temperature of from 100 to 800° C., and the substrate with film has high transmittance in a visible light region and has high gas barrier property, and accordingly, the substrate with film is useful as a substrate for a display such as a liquid crystal display device or an organic EL.

Particularly, a glass made of a fluorophosphate glass has high gas barrier property, high transmittance in visible light region, and excellent weather resistance, and thus, such a film is useful.

EXPLANATION OF NUMERALS

1: Substrate
2: Organic element
3: Inorganic amorphous film
4: Under layer film
10: Substrate with film (sealing substrate)

BEST MODE FOR CARRYING OUT THE INVENTION

As a substrate to be employed for the substrate with film of the present invention, a film substrate or a glass substrate may, for example, be mentioned. When the substrate is a film substrate, the material of the film substrate is not particularly limited, and a polycarbonate resin, a PET (polyethylene terephthalate) resin or an acrylic resin may, for example, be mentioned. The thickness of such a film substrate is from 50 to 500 μm, particularly preferably from 100 to 400 μm for the reason that such a film substrate exhibits light weight and excellent flexibility.

When the substrate is a glass substrate, the composition of the glass is not particularly limited. Further, the thickness of the glass substrate currently produced can be used as it is, and the thickness of the glass substrate is preferably from 0.05 to 5 mm. However, in order to use such a glass substrate as a substrate having a bendable shape, the glass substrate is preferably a thin plate of from 0.05 to 0.3 mm thick. The shape of the substrate may be any type such as a flat plane, a diffused plane, a concave plane, a convex plane or a trapezoid.

Further, the substrate preferably has a transmittance of at least 65% in entire wavelength region of from 400 to 700 nm. Namely, in the wavelength region of from 400 to 700 nm, the substrate preferably has a minimum transmittance (hereinafter referred to as minimum visible light transmittance) of at least 65%, more preferably at least 70%, more preferably at least 75%, more preferably at least 80% and more preferably at least 85% from the viewpoint of transparency. Here, since a glass substrate itself usually has gas barrier property, a glass substrate is used as a substrate to form e.g. an organic element thereon, namely, as a sealing substrate to be described later.

The substrate with film of the present invention includes not only a substrate provided with an inorganic amorphous film directly formed on the substrate but also a substrate provided with e.g. an organic element and an inorganic amorphous film formed on such an organic element.

Figure 1:
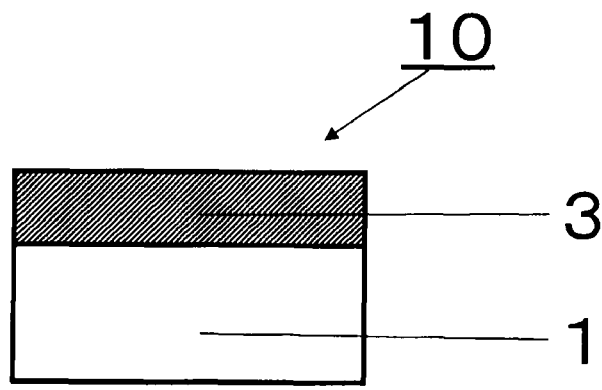
FIG. 1: A schematic laterally cross sectional view of a substrate with film of the present invention.

An example of substrate provided with an inorganic amorphous film directly formed on the substrate is specifically a substrate 10 with film having an inorganic amorphous film 3 directly formed on a substrate 1 as shown in FIG. 1.

Figure 2:
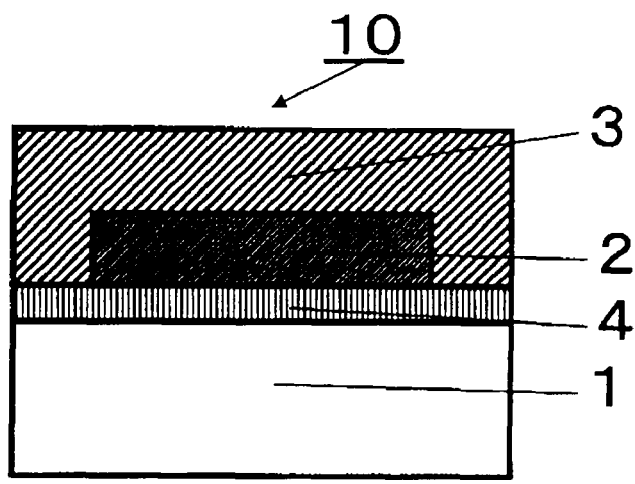
FIG. 2: A schematic laterally cross sectional view of a sealing substrate when the substrate of the present invention is a film substrate.
Figure 3:
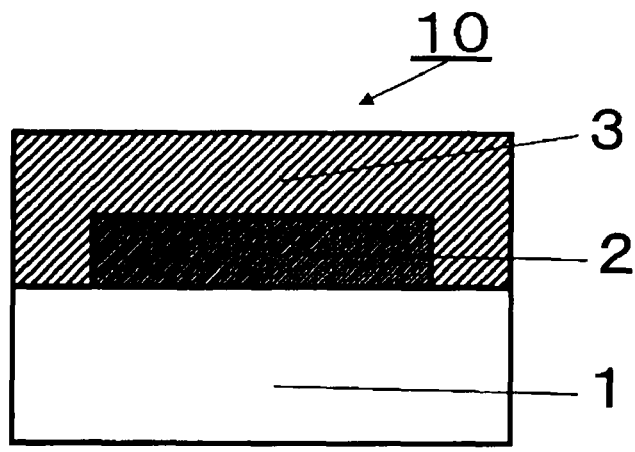
FIG. 3: A schematic laterally cross sectional view of a sealing substrate when the substrate of the present invention is a glass substrate.

Further, an example of substrate provided with e.g. an organic element is specifically a substrate 10 with film shown in FIGS. 2 and 3 comprising a substrate 1, an organic element 2 formed on the substrate and an inorganic amorphous film 3 formed on the element. Such a substrate with film comprising a substrate, an organic element formed on the substrate and an inorganic amorphous film formed on the element, is referred to as a sealing substrate.

The sealing substrate of the present invention is described with reference to FIGS. 2 and 3. FIG. 2 is a schematic laterally cross sectional view of the sealing substrate when the substrate is a film substrate, and FIG. 3 is a schematic laterally cross sectional view of the sealing substrate when the substrate is a glass substrate.

In FIG. 2, when the substrate 1 is a film substrate, since a film substrate usually has insufficient gas barrier property, an under layer film 4 is formed in most cases. The under layer film 4 also preferably has gas barrier property. The process for producing the under layer film 4 is not particularly limited, and it can be formed by using a vapor deposition apparatus or a sputtering apparatus. Then, on the film 4, an organic element 2 having e.g. an electrode and an organic light emission layer are formed. The process for producing the organic element 2 is also not particularly limited, and it can be formed by using a film-forming apparatus such as a vapor deposition apparatus or a spin coater. Thereafter, an inorganic amorphous film 3 is formed to form a sealing substrate of the present invention. Thereafter, on the sealing substrate 10, e.g. a film is formed to form an organic EL display.

In FIG. 3, when the substrate 1 is a glass substrate, since a glass has sufficient gas barrier property in most cases, it is not necessary to form an under layer film 4 differently from the case of film substrate. Subsequently, an organic element 2 having e.g. an electrode and an organic light emission layer is formed on the glass. The process for producing the organic element 2 is also not particularly limited, and it can be formed by using a film-forming apparatus such as a vapor deposition apparatus or a spin coater. Thereafter, the inorganic amorphous film 3 is formed to form the sealing substrate 10 of the present invention. Thereafter, e.g. a film is formed on the sealing substrate 10, to form an organic EL display.

Here, the composition of the under layer film 4 is not particularly limited. However, considering gas barrier property or productivity, the under layer film 4 preferably has the same composition as that of the inorganic amorphous film 3.

As an organic EL element being one type of the organic element 2, a usually used element can be used as it is. Specifically, such an element has a construction that an anode, a hole injection layer, a hole transportation layer, a light emission layer and a cathode are laminated in this order. As the material of the anode, a metal having large work function such as tin-doped indium oxide (hereinafter referred to as ITO) is mentioned. As the material of the hole injection layer, one having injection function capable of accepting holes injected from the anode or from the hole transportation layer at a time of electric field application, such as copper phthalocyanine (hereinafter referred to as CuPc), is mentioned. As the material of the hole transportation layer, one having a transportation function capable of moving injected holes, such as diphenylnaphthyldiamine (hereinafter referred to as NPD), is mentioned. As the material of the light emission layer, one capable of forming a layer having e.g. light emission function capable of providing a field of recoupling electrons and holes to lead to light emission, such as alumina quinoline (hereinafter referred to as Alq), is mentioned. As the material of the cathode, a metal having small work function, such as magnesium, is mentioned.

The inorganic amorphous film employed in the substrate with film of the present invention, preferably has a softening temperature of from 100 to 800° C. When the softening temperature exceeds 800° C., as in e.g. a case of $SiO_2$ film, a dense film is hardly obtainable, and its gas barrier property tends to be poor, such being not preferred. The softening temperature is preferably from 100 to 700° C. It is more preferably from 150 to 700° C., further preferably from 150 to 500° C. It is the most preferably from 150 to 400° C.

The inorganic amorphous film preferably has a glass transition temperature of from 50 to 500° C. If the glass transition temperature exceeds 500° C., as in e.g. a case of $SiO_2$ film, a dense film is hardly obtainable, and its gas barrier property tends to be poor, such being not preferred. The glass transition temperature is preferably from 50 to 400° C., more preferably from 100 to 400° C., more preferably from 50 to 300° C., more preferably from 100 to 300° C. It is the most preferably from 100 to 200° C. And still further preferably, both of the softening temperature and the glass transition temperature are within the above respective ranges. Here, the glass transition temperature means a temperature at which a property such as a specific heat becomes discontinuous in the second order phase transition.

The inorganic amorphous film of the present invention is excellent in gas barrier property since its film-forming material tends to be amorphous and crystalline grains are not formed. If the film-forming material hardly becomes amorphous and crystalline grains are formed (as in e.g. a case of $Al_2O_3$ film), grain boundaries tend to be formed in the film to cause defects such as pinholes, and accordingly, its gas barrier property tends to be poor, such being not preferred.

As the material of the inorganic amorphous film may, specifically, be a borate glass containing $B_2O_3$ as the main component, a phosphate glass containing $P_2O_5$, a tellurite type composition containing $TeO_2$ as the main component, a bismuth oxide type composition containing $Bi_2O_3$ as the main component, or a chalcogenide type composition containing at least one type of element selected from the group consisting of S, Se and Te.

The chalcogenide type composition may, for example, be a composition as a combination of at least one type of element selected from the group consisting of As, Ge, P, Sb, Si, Sn, In, Ga, Bi, Pb, An and Ag and at least one type of element selected from the group consisting of S, Se and Te.

The chalcogenide type composition is particularly preferably a GeS type composition since its composition range for forming amorphous is wide. It is preferred that the content of Ge is from 5 to 40 mol % and the content of S is from 60 to 95 mol % in the GeS type composition film, since such a composition forms a film without sacrificing the transparency.

The chalcogenide type composition may contain halogen elements (Cl, Br, I). Such halogen elements contained in the composition lower the glass transition temperature of the amorphous film, such being preferred.

The material of the inorganic amorphous film is particularly preferably a phosphate glass containing $P_2O_5$ since such a material is excellent in gas barrier property. The reason why phosphate glass is excellent in gas barrier property is assumed to be that arrangement of atoms constituting glass has little gaps and water vapor molecules are hardly diffused. The content of $P_2O_5$ in the phosphate glass is preferably at least 5 mol %, more preferably at least 30 mol %, more preferably at least 60 mol %, more preferably at least 70 mol %, more preferably at lest 80 mol %.

The phosphate glass preferably further contains SnO since such a glass is excellent in water resistance. Further, the phosphate glass may contain a compound such as $B_2O_3$, ZnO, PbO, $TeO_2$, an alkali metal acid (e.g. $Li_2O$, $Na_2O$, $K_2O$), an alkali earth metal acid (e.g. MgO, CaO) or $BiO_2$ to the extent that it does not prevent gas barrier property.

The film of phosphate glass is preferably a film (hereinafter referred to as fluorophosphate glass film) made of a fluorophosphate glass produced by mixing fluoride into the above phosphate glass and containing the fluoride and $P_2O_5$, since such a film easily becomes amorphous and is excellent in gas barrier property even if its film thickness is thin (about from 0.1 to 0.5 μm).

The fluorophosphate glass film of the present invention is excellent in gas barrier property since its film-forming material easily becomes amorphous and crystalline grains are hardly formed. When the film-forming material hardly becomes amorphous and crystalline grains are formed (such as in a case of $Al_2O_3$ film), grain boundaries tend to be formed in the film, causing defects such as pinholes, whereby the gas barrier property tends to be poor, such being not preferred.

A fluorophosphate glass film is a glass film containing a fluoride and $P_2O_5$. Specifically, the content of $P_2O_5$ in the glass film is from 5 to 39 mol %. If the content exceeds 39 mol %, weather resistance may be poor and a problem that a quality-changed layer is formed on a film surface which deteriorates gas barrier property, such being not preferred. Further, the content of fluoride is preferably 1 to 70 mol % in the glass film since such a glass film is excellent in weather resistance and such a material easily forms a glass. The content is particularly preferably 1 to 55 mol %, more preferably from 30 to 55 mol %. The fluoride means a compound containing fluorine, and it may, for example, be $SnF_2$, $ZnF_2$, $PbF_2$ or an alkali metal fluoride.

The fluorophosphate glass film may contain e.g. SnO, $B_2O_3$, ZnO, PbO, $TeO_2$, an alkali metal acid (e.g. $Li_2O$, $Na_2O$ or $K_2O$) or $BiO_2$ besides a fluoride and $P_2O_5$. Particularly, when the film-forming material contains SnO, ZnO, PbO or $B_2O_3$, a film having high weather resistance can be formed, such being preferred. When the fluorophosphate glass film contains SnO, the content of SnO is preferably from 1 to 80 mol %, particularly preferably from 15 to 60 mol %.

The fluorophosphate glass film more preferably contains SnO and $SnF_2$, that is, the fluorophosphate glass film is more preferably a tin oxyfluoride-phosphate glass film for the reason that its composition range for forming amorphous is wide and it has low melting point. When the fluorophosphate glass film contains a material (such as SnO) having water resistance, a film having high weather resistance can be formed, and when the film contains $SnF_2$, there is a merit that a dense film can be formed. When the fluorophosphate glass film contains SnO and $SnF_2$, the content of $P_2O_5$ is preferably from 5 to 39 mol %, the content of SnO is preferably from 1 to 80 mol %, and the content of $SnF_2$ is from 1 to 60 mol %. The melting point of the fluorophosphate glass is preferably at most 800° C., particularly preferably at most 400° C. in order to form a dense film.

The film thickness of the inorganic amorphous film is preferably from 0.1 to 5 μm, more preferably from 0.1 to 4 μm, more preferably from 0.2 to 3 μm, more preferably from 0.1 to 1 μm. If the thickness is less than 0.1 μm, desired gas barrier property is hard to be obtained, and e.g. pinholes tend to be formed, such being not preferred. If the thickness exceeds 5 μm, the substrate becomes hard to be bent to a desired shape, and a crack may be formed in the film when the substrate is bent, such being not preferred. Here, the film thickness means the film thickness of the inorganic amorphous film covering an organic element at a portion on the element.

The inorganic amorphous film of the present invention is preferably formed via a gas phase. "Forming via a gas phase" means "a raw matrix material is once transformed into a gas and subsequently deposited to form a film". Specifically, the inorganic amorphous film can be formed by a method such as a vacuum vapor deposition method, a sputtering method or a CVD method, by using a material of the inorganic amorphous film. Particularly, for the reason that a film having desired thickness can be formed on a substrate of large area within a short time, a vacuum vapor deposition method is preferably used. As the material of the inorganic amorphous film, a borate glass containing $B_2O_3$ as the main component, a phosphate glass containing $P_2O_5$, a tellurite type composition containing $TeO_2$ as the main component, a bismuth oxide type composition containing $Bi_2O_3$ as the main component, or a chalcogenide type composition containing at least one type of element selected from the group consisting of S, Se and Te.

In a case of forming the inorganic amorphous film by a vacuum vapor deposition method, a glass matrix material being a raw material for forming the inorganic amorphous film is vaporized as the temperature is raised, so that the glass matrix material is, via a gas phase, deposited on a substrate to form a film. As an alternative, the method may be such that components constituting the glass film in a form of respective raw materials are vaporized simultaneously and they are, via gas phases, deposited on a substrate. The glass matrix material is preferably constituted by components having relatively high vapor pressure from the viewpoint of increasing film-forming speed.

Namely, when the inorganic amorphous film contains a material having relatively high vapor pressure, it is possible to increase film-forming speed and to easily control the composition of the inorganic amorphous film to be formed, such being preferred. Specific example of the above material having relatively high vapor pressure may be a phosphate, a fluoride such as SnO or $SnF_2$, a chloride such as $SnCl_2$, $B_2O_3$, an alkali borate, $Na_2O$, $K_2O$ or $TeO_2$. The vapor pressure of such a material having relatively high vapor pressure contained in the inorganic amorphous film, is preferably at least $1 \times 10^{-7}$ atm ($1 \times 10^{-2}$ Pa) at 1,600° C. For example, the vapor pressure of $SnF_2$ is 249 atm at 1,600° C. On the other hand, the vapor pressures of $Al_2O_3$ and MgO are less than $1 \times 10^{-7}$ atm ($1 \times 10^{-2}$ Pa) at 1,600° C. Here, the vapor pressures of compounds such as SnO, $SnF_2$, $B_2O_3$, $K_2O$, $TeO_2$, $Al_2O_3$ and MgO at from 0° C. to 1,600° C. can be obtained by calculating respective vapor pressure curves by using a thermodynamics calculation software (OUTOKUMPU-RESEARCH-OY Corporation: HSC Chemistry), or they can be obtained by calculating free energy difference between those of the gas phase and the condensed phase of each of the compounds.

Some type of raw material for the inorganic amorphous film contains several types of different components, and thus, there is a case where the composition of the raw material of the inorganic amorphous film is different from that of an inorganic amorphous film formed from the raw material, depending on the vapor pressures of the different components. For example, in a case where the phosphate glass contains MgO having low vapor pressure, when the phosphate glass film is attempted to form by a vacuum vapor deposition method, MgO is not vaporized and MgO is not contained in the phosphate glass film, whereby a phosphate glass film having a desired composition can not be formed. Accordingly, each of the components constituting the inorganic amorphous film preferably has a vapor pressure of at least $1 \times 10^{-7}$ ($1 \times 10^{-2}$ Pa) atm at 1,600° C. as described above. For example, a component contained in the phosphate glass may, specifically, be SnO, a fluoride such as $SnF_2$, $B_2O_3$, $Na_2O$, $K_2O$ or $TeO_2$ etc.

The inorganic amorphous film preferably has a minimum visible light transmittance of at least 65%, particularly preferably at least 70% since such a film can be used in a light-output side, and the brightness of top emission type organic EL displays can be maintained. The minimum visible light transmittance is more preferably at least 80%, the most preferably at least 90%.

In the substrate with film of the present invention, the inorganic amorphous film may be provided on one side of the substrate or it may be provided on each side of the substrate. Further, the constructions of the inorganic amorphous films formed on the respective side may be the same or the different. Further, in order to impart other properties, e.g. an anti-reflective film or an insulation film may be formed on the inorganic amorphous film, and e.g. an under layer film may be provided between the inorganic amorphous film and the substrate. However, from the viewpoint of productivity, it is preferred to constitute a substrate with gas barrier film by only a single layer of inorganic amorphous film. The inorganic amorphous film of the present invention is excellent in a point that a single layer of the film can exhibit favorable gas barrier property.

The substrate with film of the present invention preferably has a minimum visible light transmittance of at least 65%. The minimum visible light transmittance is particularly preferably at least 70% to maintain transparency of the substrate when the substrate is used for a display. Further, the minimum visible light transmittance is more preferably at least 75%, more preferably at least 80% and particularly preferably at least 90%.

Further, the substrate with film of the present invention is preferably insulative since such a substrate does not prevent operation of electric devices formed on the surface of the film substrate.

Further, the average expansion coefficient of the material of the inorganic amorphous film at from 50° C. to 350° C., is preferably from $100 \times 10^{-7}$ to $500 \times 10^{-7}$/° C., particularly preferably from $150 \times 10^{-7}$ to $500 \times 10^{-7}$/° C. when the substrate is a film substrate from the viewpoint of compatibility of expansion coefficients between the substrate and a display element such as an organic element. Further, when the substrate is a glass substrate, for the same reason as above, the expansion coefficient is preferably from $20 \times 10^{-7}$ to $100 \times 10^{-7}$/° C. Further, for the requirement of applying etching to a conductive film on a substrate, the material is preferably excellent in chemical resistance.

In order to impart other properties, e.g. an antireflective film or an insulation film may be provided on the inorganic amorphous film, and e.g. an under layer film may be provided between the inorganic amorphous film and an organic element. However, from the viewpoint of productivity, it is preferred that a single layer of inorganic amorphous film seals the organic element. The sealing substrate of the present invention is excellent in productivity since it employs an inorganic amorphous film having favorable gas barrier property even if it is a single layer.

The sealing substrate of the present invention may be continuously formed by using a roll-to-roll method when the substrate is a film substrate. The sealing substrate of the present invention is applicable to a bendable display.

The organic element of the present invention means an element made of an organic material, in other words, an element requiring a certain degree of gas barrier property for its operation. Specifically, it means an organic semiconductor element such as an organic EL element, an organic memory element, an organic sensor element or an organic solar cell element.

The sealing substrate of the present invention is useful particularly for a display device requiring gas barrier property since the substrate has high transparency. As such a display device, an organic EL (top emission type, bottom emission type) or an organic TFT may, for example, be mentioned.

The substrate with film of the present invention is useful as a substrate for a display such as an organic EL, a liquid crystal display element or an electric paper. Further, the substrate is useful as a substrate for an electric device such as a solar cell. When the gas barrier substrate of the present invention is a film substrate, the substrate has features that it is light weight and thin, it can be formed into an optional shape, and it can be produced by a roll-to-roll method.

EXAMPLES

From now, Examples 1 to 17 of the substrate with film of the present invention are described in detail. Here, the present invention is not limited to the following Examples.

Forming of Gas Barrier Film

Example 1

In a vacuum vapor deposition apparatus, a polycarbonate film substrate and a PET film substrate are placed as substrates (minimum visible light transmittance: polycarbonate film substrate 88%, PET film substrate 89%). The thickness of the polycarbonate film substrate is 250 μm and the thickness of PET film substrate is 80 μm.

As a raw material for vapor deposition, a GeS glass block (Ge: 20 mol %, S: 80 mol %) is placed in a boat tray made of Ta, an electric current of 30 A is applied to the boat tray to vaporize glass component in the vacuum vapor deposition apparatus, to form respective GeS films on the two types of film substrates. The composition of the GeS films formed is the same as the GeS glass block being the raw material. The film thickness of the GeS film formed is 0.7 μm. The glass transition temperature of the GeS film formed is 250° C. according to measurement by DTA. The softening point of the GeS film formed is 750° C. according to measurement by DTA. Further, the GeS film formed is amorphous according to measurement by a diffraction X-ray method.

The gas barrier film formed has high barrier property.

Figure 4:
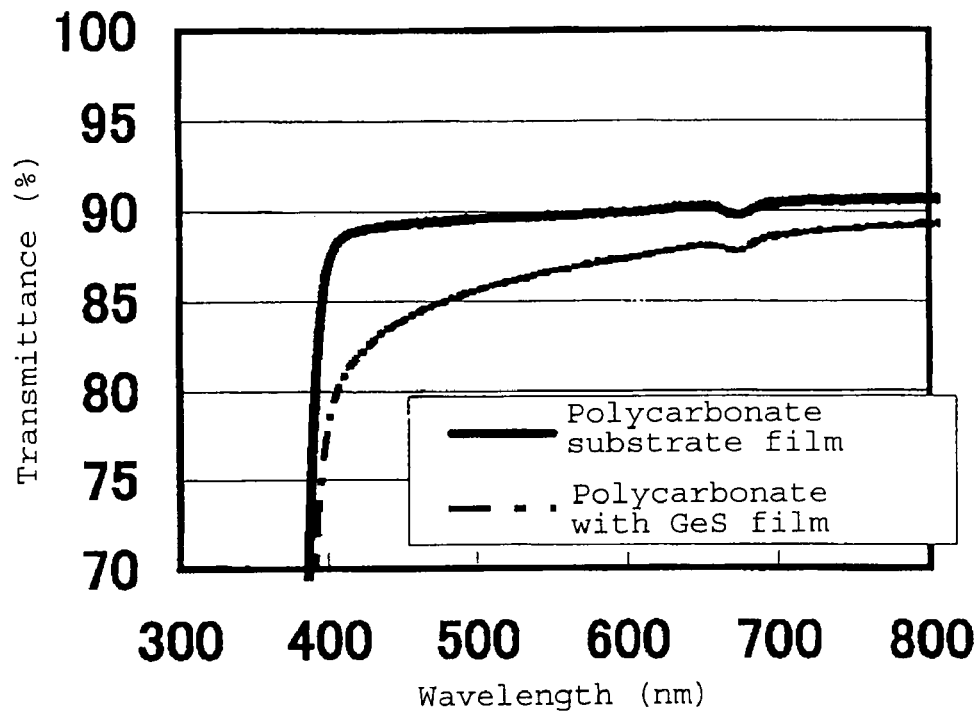
FIG. 4: A view showing transmittance of a film substrate (polycarbonate film substrate) with GeS film of the present invention.
Figure 5:
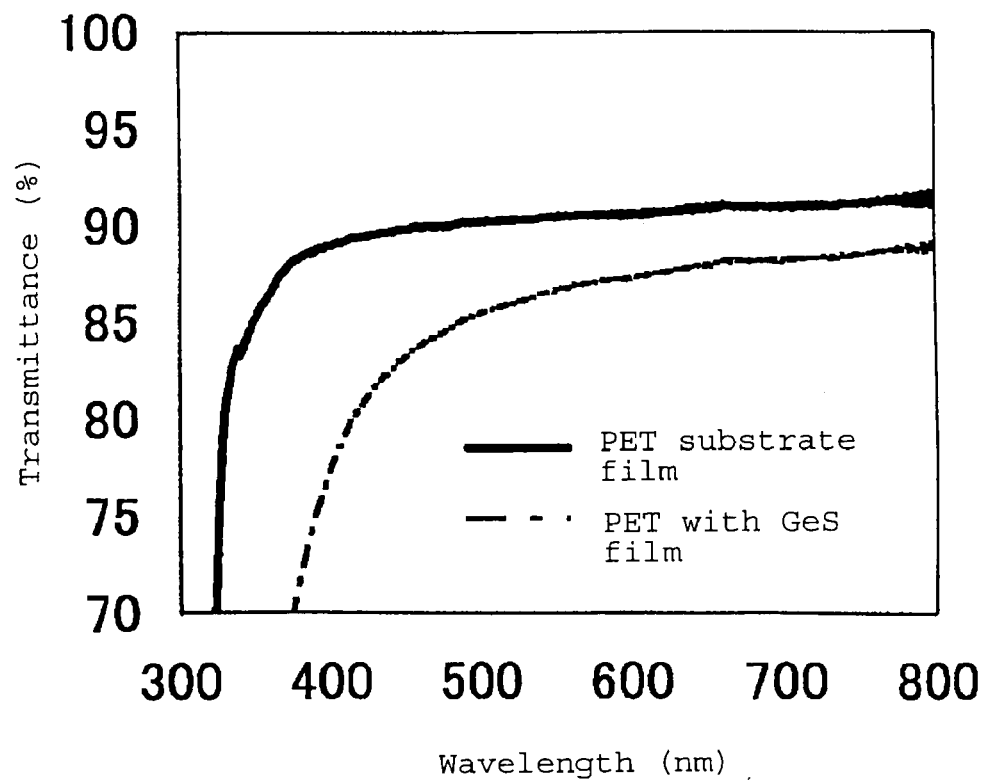
FIG. 5: A view showing the transmittance of a film substrate (PET film substrate) with GeS film of the present invention.

The minimum visible light transmittance of the film substrate with GeS film formed is evaluated by the following method, and the result of (1) is shown in FIG. 4 (polycarbonate film substrate) and FIG. 5 (PET film substrate).

(1) Minimum Visible Light Transmittance

The transmittance of the film substrate with GeS film formed, in entire wavelength region of from 400 to 700 nm, is measured by using a spectrophotometer (model U-3500 self-recording spectrophotometer: manufactured by Hitachi, Ltd.).

It is understandable from FIGS. 4 and 5 that the gas barrier film formed has high transmittance of at least 70% in terms of minimum visible light transmittance, and is excellent in transparency.

Example 2

In a vacuum vapor deposition apparatus, a polycarbonate film substrate and a PET film substrate are placed as substrates in the same manner as Example 1.

As a raw material to be evaporated, a SnO—$P_2O_5$—MgO glass block ($P_2O_5$: 31.3 mol %, SnO: 63.8 mol %, MgO: 4.9 mol %) having a glass transition temperature of 310° C. and a softening temperature of 404° C., was put in a boat tray made of Ta, electric current of 25 A was applied to the boat tray to vaporize glass components in the vacuum vapor deposition apparatus, to form a SnO—$P_2O_5$ glass film ($P_2O_5$: 44.0 mol %, SnO: 56.0 mol %; hereinafter referred to as $P_2O_5$ type glass film) on each of the two types of film substrates. The film thickness of the formed $P_2O_5$ type glass film was 0.45 μm. Further, the formed $P_2O_5$ type glass film was amorphous according to measurement by using a diffraction X-ray method.

Here, as also to be described in Example 10, MgO has low vapor pressure and is not contained in the $P_2O_5$ type glass film.

Figure 7:
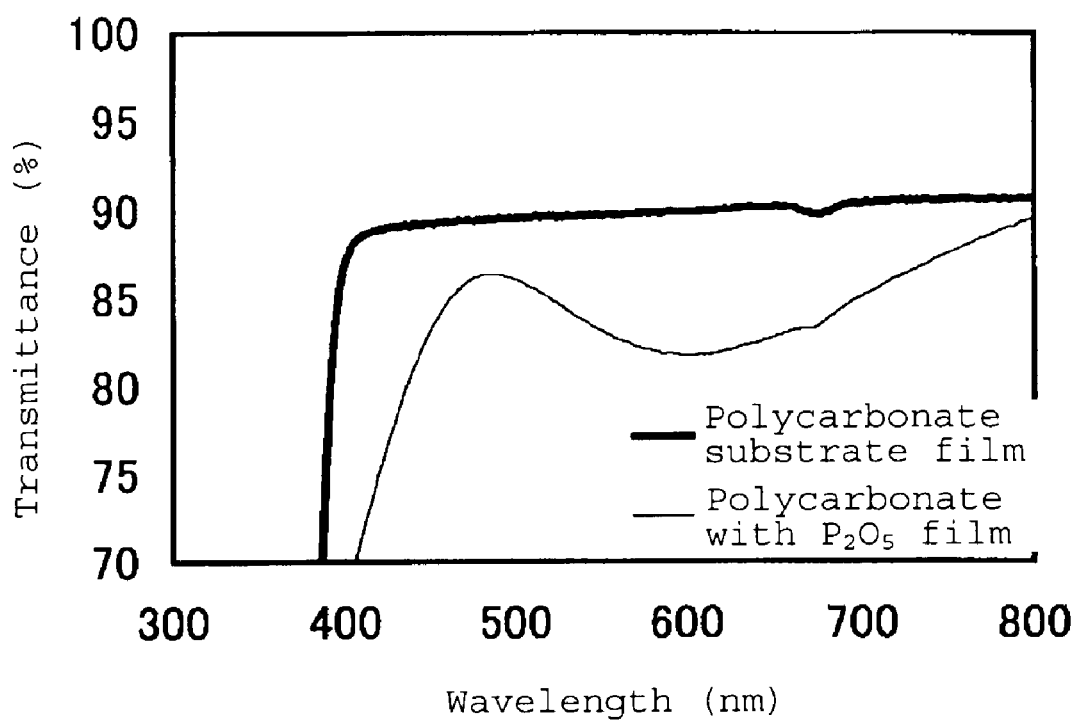
FIG. 7: A view showing the transmittance of a film substrate (polycarbonate film substrate) with a $P_2O_5$ type glass film of the present invention.
Figure 8:
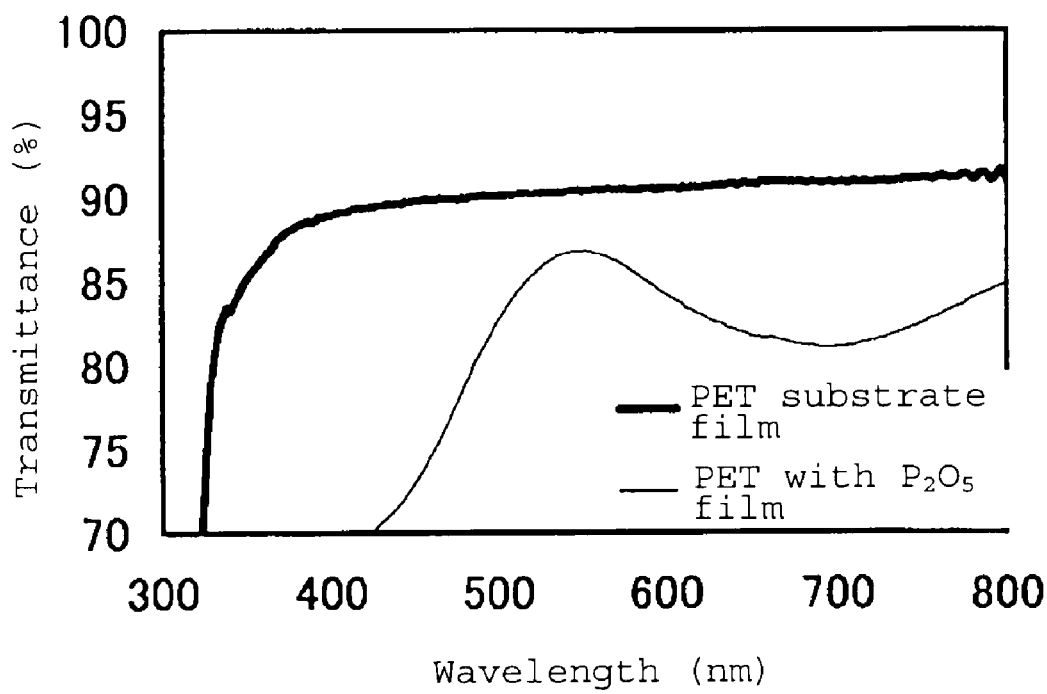
FIG. 8: A view showing the transmittance of a film substrate (PET film substrate) with a $P_2O_5$ type glass film of the present invention.

The minimum visible light transmittance of the $P_2O_5$ type glass film formed was evaluated in the same manner as Example 1 and the results are shown in FIG. 7 (polycarbonate film substrate) and FIG. 8 (PET film substrate).

It is understandable from FIGS. 7 and 8 that the formed gas barrier films have high transmittances of at least 65% in the entire wavelength region of from 450 to 700 nm and that they are excellent in transparency.

Example 3

Evaluation of Gas Barrier Film

In a vacuum degassing apparatus, a metal Ca thin film was formed on a glass substrate so that the thin film has a circular shape having a diameter of 1 cm. Then, while the substrate was retained in the vacuum vapor deposition apparatus, a $P_2O_5$ type glass film of 0.45 μm thick was formed in the same manner as Example 2. At this time, the metal Ca thin film was partially masked so that the $P_2O_5$ type glass was not formed on the masked portion. Thereafter, the substrate was taken out from the vacuum vapor deposition apparatus, and left in an atmospheric air at a room temperature to evaluate its gas barrier property.

Figure 6:
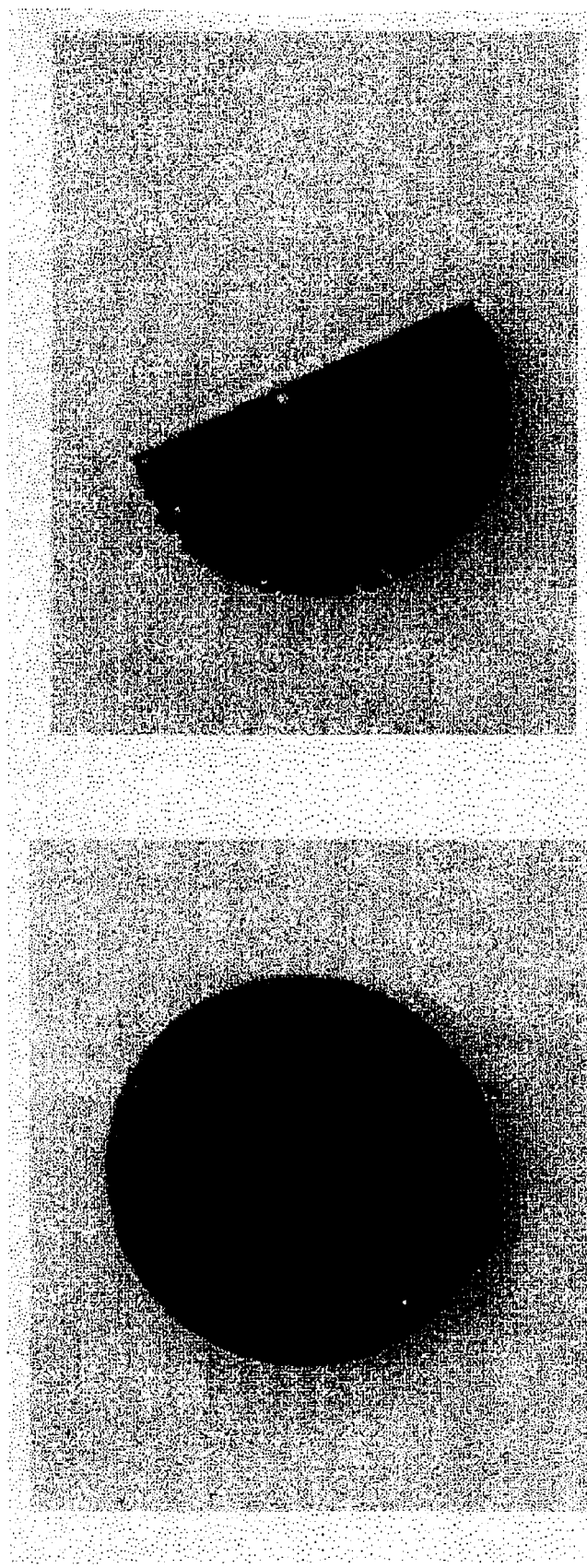
FIG. 6: A view showing evaluation result of gas barrier property of the present invention.

At an elapsed time of 0.5 hour, no significant change of Ca was recognized (FIG. 6(A)). However, at an elapsed time of 16.6 hours, a portion of the metal Ca thin film not covered with the $P_2O_5$ type glass thin film (right semicircle in FIG. 6(B)), was reacted with water vapor in the atmospheric air and lost its metallic gloss. On the other hand, a portion of the metal Ca thin film (left semicircle in FIG. 6(B)) covered with the $P_2O_5$ type glass thin film, retained its metal gloss even at an elapsed time of 16.6 hours (FIG. 6(B)). These results indicate that the $P_2O_5$ type glass film has excellent gas barrier property.

Here, the above evaluation method using metal Ca thin film is described in the following document: G. Nisato, P. C. P Bouten, P. J. Slikkerveer, W. D. Bennet, G. L. Graff, N. Rutherford, L. Wiese, "Evaluating High Performance Diffusion Barriers: the Calcium Test", Asia Display/IDW '01 Proceedings, (2001), pp 1435-1438. This evaluation method was newly developed to measure water vapor permeability lower than the detection limit of water vapor permeability (about $5\times10^{-3}$ g/m²/day) by conventional gas permeability measurement apparatuses. Accordingly, it is sufficiently presumable that the metal Ca with the $P_2O_5$ type glass film of Example 2 has a water vapor permeability of $5\times10^{-3}$ g/m²/day or lower.

Forming of Gas Barrier Film

Example 4

In a vacuum vapor deposition apparatus, as a substrate, a polycarbonate film substrate was placed (minimum visible light transmittance: polycarbonate film substrate 88%). The thickness of the film substrate was 250 μm. As a raw material to be vapor deposited, a $SnO$—$SnF_2$—$P_2O_5$ glass block ($P_2O_5$: 25 mol %, SnO: 30 mol %, $SnF_2$: 45 mol %, glass transition temperature: 110° C.) was put in a boat tray made of Ta, electric current of 20 A was applied to the boat tray to vaporize glass components in the vacuum vapor deposition apparatus, to form a $SnO$—$SnF_2$—$P_2O_5$ glass film on the film substrate. The average linear expansion coefficient of the glass block from 50° C. to 300° C. was $185\times10^{-7}$/K according to the measurement of TMA (measurement apparatus: TMA, manufactured by Bruker AXS).

The film thickness of the formed $SnO$—$SnF_2$—$P_2O_5$ glass film was 0.2 μm. The composition of the $SnO$—$SnF_2$—$P_2O_5$ glass film was such that $P_2O_5$: 21 mol %, SnO: 27 mol %, and $SnF_2$: 52 mol %. Here, the glass transition temperature of the $SnO$—$SnF_2$—$P_2O_5$ glass block was 110° C. according to the measurement by DTA (measurement apparatus: DTA, manufactured by Bruker AXS).

Figure 9:
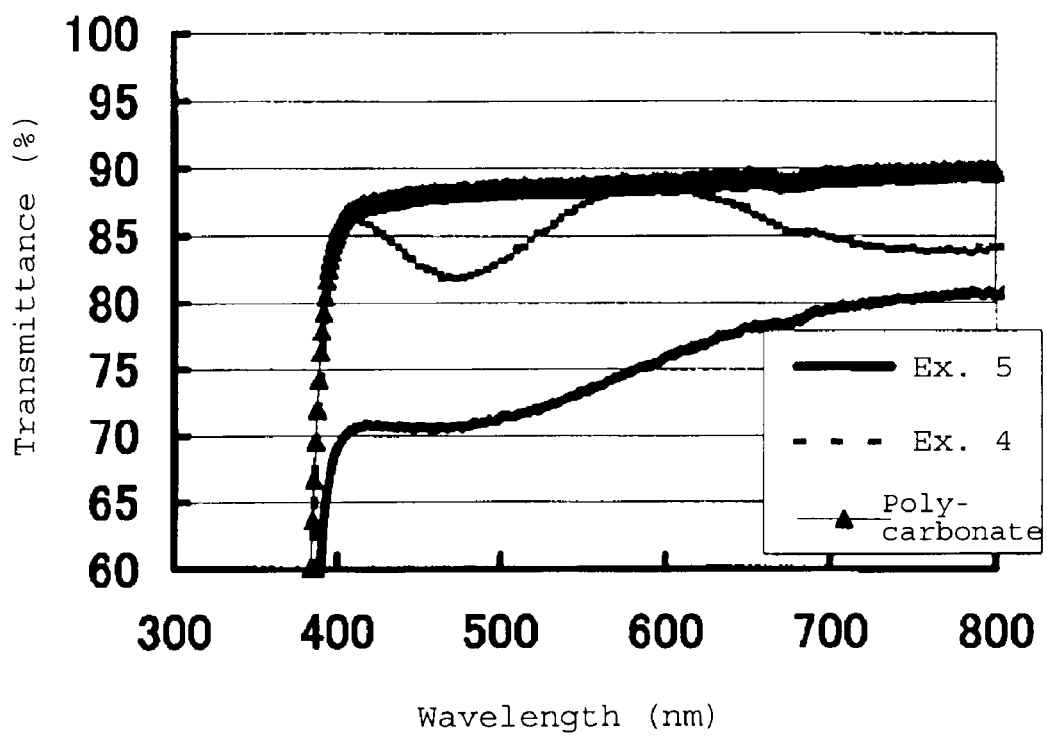
FIG. 9: A view showing the transmittance of a film substrate with SnO—$SnF_2$—$P_2O_5$ glass film of the present invention.

With respect to the film substrate with $SnO$—$SnF_2$—$P_2O_5$ glass film formed, the transmittance in entire wavelength region of from 400 to 700 nm was measured by using a spectrophotometer (model U-3500 self-recording type spectrophotometer: manufactured by Hitachi, Ltd.). FIG. 9 shows the result.

Example 5

A $SnO$—$SnF_2$—$P_2O_5$ glass film was obtained in the same manner as Example 4 except that a $SnO$—$SnF_2$—$P_2O_5$ glass block having different composition ($P_2O_5$: 25 mol %, SnO: 45 mol %, $SnF_2$: 30 mol %, glass transition temperature: 125° C., average linear expansion coefficient (measurement method is the same as that of Example 4): $180\times10^{-7}$/K). The film thickness of the formed $SnO$—$SnF_2$—$P_2O_5$ glass film was 0.4 μm.

With respect to a film substrate with $SnO$—$SnF_2$—$P_2O_5$ glass film formed, the transmittance in the entire region of from 400 to 700 nm was measured by using a spectrophotometer (model U-3500 self-recording type spectrophotometer: manufactured by Hitachi, Ltd.). FIG. 9 shows the result.

Example 6

A $SnO$—$SnF_2$—$P_2O_5$ glass film was obtained in the same manner as Example 4 except that a glass substrate (minimum visible light transmittance: 86%, plate thickness 2.8 mm) was used instead of a polycarbonate film substrate. The film thickness of the formed $SnO$—$SnF_2$—$P_2O_5$ glass film was 0.4 μm.

Figure 10:
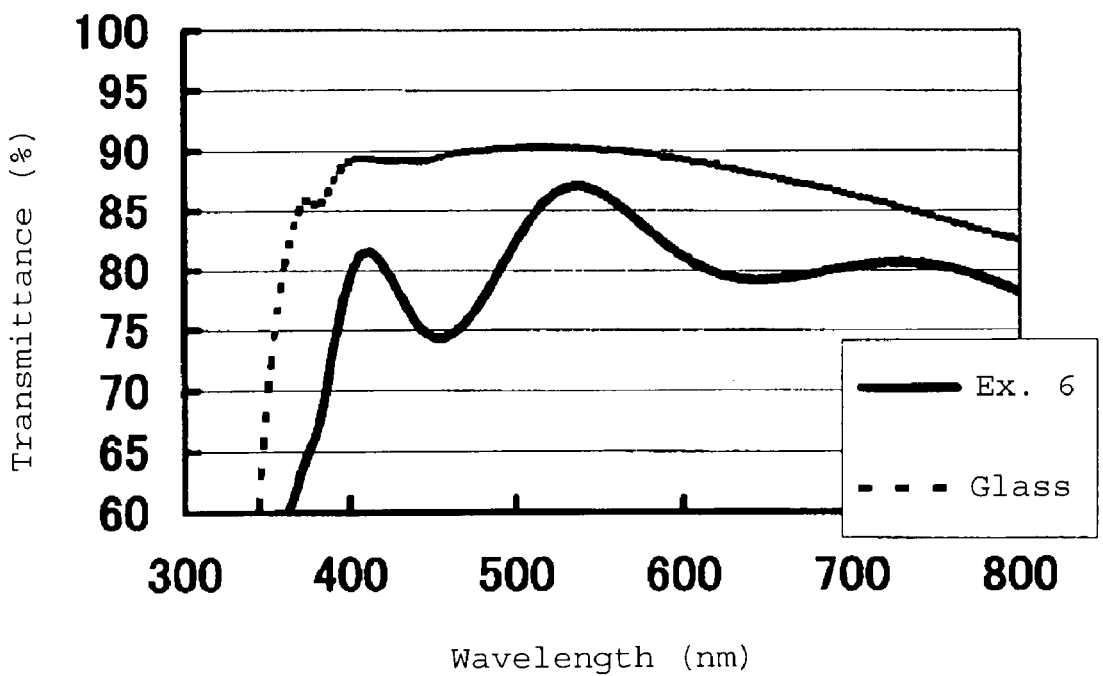
FIG. 10: A view showing the transmittance of a glass substrate with SnO—$SnF_2$—$P_2O_5$ glass film of the present invention.

The transmittance of a glass substrate with $SnO$—$SnF_2$—$P_2O_5$ glass film formed was measured by using a spectrophotometer (model U-3500 self-recording type spectrophotometer: manufactured by Hitachi, Ltd.). FIG. 10 shows the result.

It is understandable from FIG. 10 that the formed gas barrier substrate has high transmittance of at least 65% in terms of minimum visible light transmittance, and is excellent in transparency.

Table 1 shows the compositions and properties of the films formed in Examples 1, 2 and 4 to 6.

TABLE 1

| Ex. | Film composition | Thickness μm | Glass transition temperature ° C. | Softening temperature ° C. | Minimum visible light transmittance (%) | | |
|---|---|---|---|---|---|---|---|
| | | | | | Poly-carbonate | PET | Glass |
| 1 | Ge20%:S80% | 0.7 | 250 | 750 | 80 | 77 | — |
| 2 | P2O5 44%:SnO56% | 0.45 | 310 | 404 | 69 | 68 | — |
| 4 | P2O5 21%:SnO27%:SnF52% | 0.2 | 110 | 140 | 82 | — | — |
| 5 | P2O5 10%:SnO14%:SnF76% | 0.4 | 125 | 157 | 69 | — | — |
| 6 | P2O5 21%:SnO27%:SnF52% | 0.4 | 113 | 140 | — | — | 74 |

Evaluation of Gas Barrier Property

The gas barrier films formed in Examples 4 to 6 have high gas barrier properties. In order to confirm these properties, the following experiments were carried out.

Example 7

Evaluation was Made in the Same Manner as Example 3

Specifically, in a vacuum vapor deposition apparatus, first of all, a thin film of metal Ca was formed on a glass substrate so that the thin film had a circular shape of 1 cm in diameter. Subsequently, while the substrate was retained in the vacuum vapor deposition apparatus, a glass film of 0.4 μm thick was formed by using a $SnO$—$SnF_2$—$P_2O_5$ glass block ($P_2O_5$: 25 mol %, SnO: 30 mol %, $SnF_2$: 45 mol %) in the same manner as Example 4. At this time, the metal Ca thin film was partially masked so that glass film was not formed on the masked portion. Thereafter, the substrate was taken out from the vacuum vapor deposition apparatus and placed in the atmospheric air.

The result was similar to that of Example 3. No significant change was recognized at an elapsed time of 0.5 hour, but at an elapsed time of 16.6 hours, a portion of metal Ca thin film not covered with glass film, reacted with water vapor in the atmospheric air and its metallic gloss was lost. On the other hand, a portion of the metal Ca thin film covered with glass film retained its metallic gloss even at an elapsed time of 16.6 hours. Further, when the experiment was continued, the portion of metal Ca thin film covered with glass film retained its metallic gloss even at an elapsed time of 2,184 hours. These results indicate that the $SnO$—$SnF_2$—$P_2O_5$ glass film has excellent gas barrier property.

Accordingly, it is sufficiently presumable that the $SnO$—$SnF_2$—$P_2O_5$ glass films of Examples 4 to 6 have water vapor permeability of $5\times10^{-3}$ $g/m^2/day$ or lower.

Example 8

Differently from Example 7 in which the glass film was left in the atmospheric air, the glass film was left in a constant-temperature constant-humidity chamber of 60° C.90% RH.

Specifically, in a vacuum vapor deposition apparatus, a thin film of metal Ca was formed on a glass substrate so that the thin film had a circular shape of 1 cm in diameter. Consequently, while the substrate was left in the vacuum vapor deposition apparatus, a glass film of 0.4 μm thick was formed by using a $SnO$—$SnF_2$—$P_2O_5$ glass block ($P_2O_5$: 25 mol %, SnO: 30 mol %, $SnF_2$: 45 mol %) in the same manner as Example 4. At this time, the metal Ca thin film was partially masked so that glass film was not formed on the masked portion. Thereafter, the substrate was taken out from the vacuum vapor deposition apparatus, it was placed in a constant-temperature constant-humidity chamber of 60° C.90% RH, and the same evaluation as that of Example 7 using metal Ca thin film was carried out.

At an elapsed time of 24 hours, a portion of the metal Ca thin film not covered with glass film, reacted with water vapor in the atmospheric air and its metallic gloss was lost. On the other hand, a portion of the metal Ca thin film covered with glass film, maintained its metallic gloss even at an elapsed time of 24 hours. Accordingly, it is sufficiently presumable that the $SnO$—$SnF_2$—$P_2O_5$ glass films of Examples 4 to 6 have water vapor permeability of $5\times10^{-3}$ $g/m^2/day$ or lower. Here, the experiment of Example 8 corresponds to accelerated experiment of Example 7.

Composition Change

Example 9

In a vacuum vapor deposition apparatus, a quartz substrate was placed as a substrate. As a raw material to be vapor deposited, a $SnO$—$SnF_2$—$P_2O_5$ glass block ($P_2O_5$: 24.4 mol %, SnO: 51.4 mol %, $SnF_2$: 24.2 mol %) was put in a boat tray made of Ta, electric current of 20 A was applied to the boat tray to vaporize glass components in the vacuum vapor deposition apparatus, to form a $SnO$—$SnF_2$—$P_2O_5$ glass film on the quartz substrate.

The composition of the glass film was measured by using a wet analysis (100 g of sample was dissolved in 110 milliliter of (1+1) hydrochloric acid, contents of Sn, P and Mg in the solution was quantified by ICP emission spectrometry and converted to mol % of respective oxides; F was quantified by using a fluorine ion electrode after the solution was neutralized, under an assumption that all amount of F forms $SnF_2$), and as a result, $P_2O_5$: 21.1 mol %, SnO: 45.9 mol %, and $SnF_2$: 33 mol %.

Example 10

A $SnO$—$MgO$—$P_2O_5$ glass film was formed on a quartz substrate in the same manner as Example 9 except that a $SnO$—$MgO$—$P_2O_5$ glass block ($P_2O_5$: 32.6 mol %, SnO: 66.4 mol %, MgO: 5.1 mol %) was used instead of a $SnO$—$SnF_2$—$P_2O_5$ glass block.

The composition of the glass film was measured by a wet analysis in the same manner as Example 9, and as a result, it was $P_2O_5$: 45.8 mol %, SnO: 58.2 mol %, and MgO: 0 mol %.

As described above, when a film containing MgO is attempted to form by using a vacuum vapor deposition method, since the vapor pressure of MgO is low, MgO is not contained in a glass film obtained. Accordingly, such a material is not preferred. On the other hand, $SnF_2$ has high vapor pressure and $SnF_2$ of a quantity equivalent to that in the raw material glass block, is contained in the film, such being preferred.

Weather Resistance

The gas barrier films formed in Examples 4 to 6 have high weather resistance. To confirm this feature, the following experiments were carried out.

Example 11

The substrates with $SnO$—$SnF_2$—$P_2O_5$ glass film formed in Examples 4 and 5 were placed still in the atmospheric air, and no change of glass films in their status was observed even at an elapsed time of 624 hours.

The substrate with $SnO$—$SnF_2$—$P_2O_5$ glass film formed in Example 6 was placed still in the atmospheric air, and change of the status of glass film was not observed even at an elapsed time of 2,100 hours.

It is considered from the above experiments that $SnO$—$SnF_2$—$P_2O_5$ glass films formed in Examples 4 to 6 have high weather resistances.

Forming of Quality-Changed Layer

Example 12

A fluorophosphate glass ($P_2O_5$: 25 mol %, SnO: 30 mol %, $SnF_2$: 45 mol %) produced by melting at 500° C. was placed still in the atmospheric air, and as a result, no quality-changed layer was formed on its surface at an elapsed time of 1 week.

Example 13

A fluorophosphate glass ($P_2O_5$: 45 mol %, SnO: 35 mol %, $SnF_2$: 20 mol %) produced by melting at 500° C. was placed still in the atmospheric air, and as a result, the glass absorbed moisture and after 1 week, a quality-changed layer was formed on a surface, but there was no practical problem.

Example 14

A fluorophosphate glass ($P_2O_5$: 40 mol %, SnO: 50 mol %, $SnF_2$: 10 mol %) produced by melting at 500° C. was placed still in the atmospheric air, and as a result, it absorbed moisture and 1 week later, a quality-changed layer was formed on a surface, but there was no practical problem.

Example 15

A fluorophosphate glass ($P_2O_5$: 45 mol %, $SnF_2$: 55 mol %) produced by melting at 500° C. was placed still in the atmospheric air, and as a result, it absorbed moisture and 1 week later, a quality-changed layer was formed on a surface, but there was no practical problem.

The results of Examples 12 to 15 show that when $P_2O_5$ is 25 mol %, that is within a range from 5 to 35 mol %, no quality-changed layer was formed on the surface and the glass film is not deteriorated by moisture in the atmospheric air, and accordingly, excellent gas barrier property is maintained for a long period of time, such being preferred.

Example 16

Sealing Substrate Using $SnO$—$SnF_2$—$P_2O_5$ Film (1) Forming of $SnO$—$SnF_2$—$P_2O_5$ Film In a vacuum vapor deposition apparatus, a polycarbonate film substrate (minimum visible light transmittance: 88%) is placed as a substrate. The thickness of the film is 250 μm.

As a raw material to be vaporized, a $SnO$—$SnF_2$—$P_2O_5$ glass matrix material ($P_2O_5$: 24.4 mol %, SnO: 51.4 mol %, $SnF_2$: 24.2 mol %, softening temperature: 200° C., glass transition temperature: 110° C.) was put in a boat tray made of Ta, electric current of 20 A was applied to the boat tray to evaporate glass components in the vacuum vapor deposition apparatus, to form a $SnO$—$SnF_2$—$P_2O_5$ film on the film substrate. The average linear expansion coefficient of the glass matrix material at from 550° C. to 300° C. was 185× $10^{-7}$/° C. according to measurement by TMA (measurement apparatus: TMA, manufactured by Bruker AXS).

The film thickness of the formed $SnO$—$SnF_2$—$P_2O_5$ film was 0.2 μm. The glass transition temperature of the $SnO$—$SnF_2$—$P_2O_5$ glass matrix material was 110° C. according to measurement by DTA (measurement apparatus: DTA, manufactured by Bruker AXS). The softening temperature of the film was equivalent to that of the matrix material.

(2) Minimum Visible Light Transmittance

Figure 11:
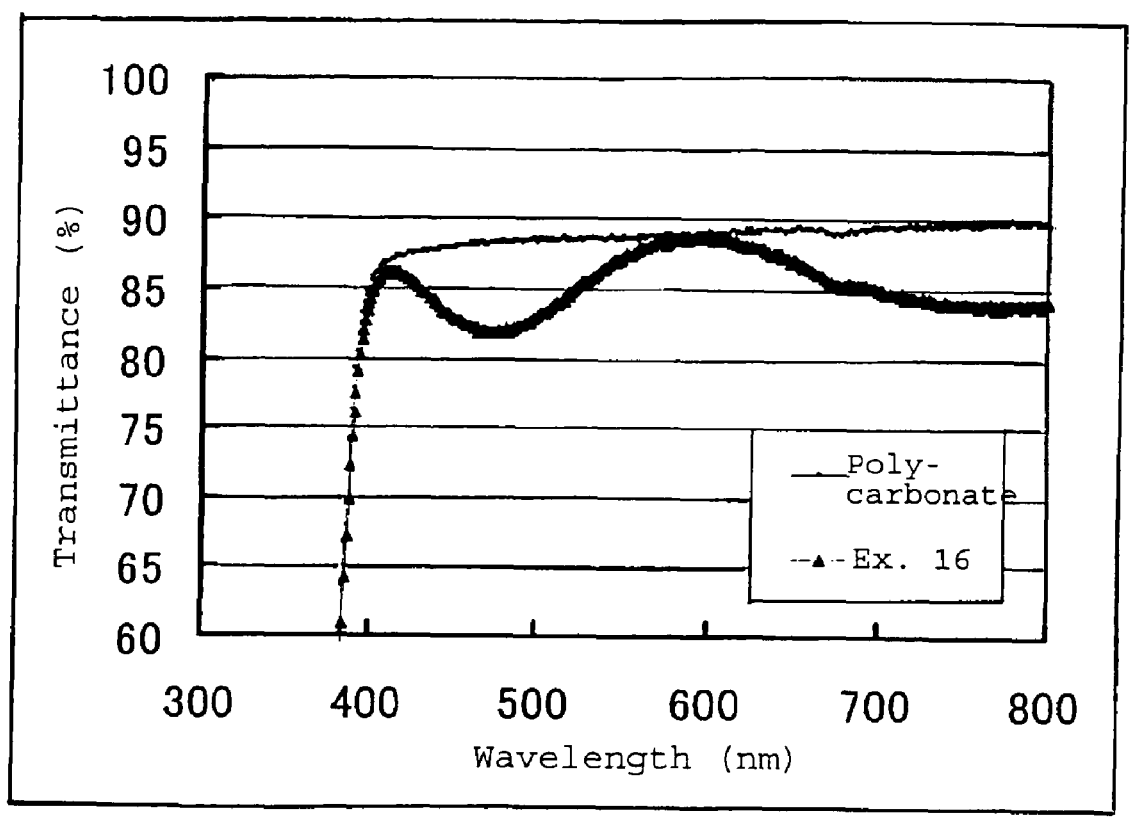
FIG. 11: A view showing the transmittance of a film substrate with SnO—$SnF_2$—$P_2O_5$ glass film of the present invention.

With respect to a film substrate with $SnO$—$SnF_2$—$P_2O_5$ glass film formed, the transmittance in entire wavelength region of from 400 to 700 nm, was measured by using a spectrophotometer (model U-3500 self-recording type spectrophotometer: manufactured by Hitachi, Ltd.). FIG. 11 shows the result. It is understandable from FIG. 11 that the formed gas barrier film has high transmittance of at least 70% in terms of minimum visible light transmittance in entire wavelength region of from 400 to 700 nm, and that the film is excellent in transparency.

(3) Composition Analysis

A $SnO$—$SnF_2$—$P_2O_5$ glass film was obtained in the same manner as the above except that a quartz glass substrate was employed instead of the polycarbonate film substrate. The composition of the $SnO$—$SnF_2$—$P_2O_5$ glass film was measured by a wet analysis (100 g of sample was dissolved in a 110 milliliter of (1+1) hydrochloric acid, the contents of Sn and P in the solution were quantified by ICP emission analysis and converted into mol % of the respective oxides; the content of F was quantified by a fluorine ion electrode after the solution was neutralized, under an assumption that all amount of F forms $SnF_2$), and as a result, the contents were $P_2O_5$: 21.1 mol %, SnO: 45.9 mol %, $SnF_2$: 33 mol %.

(4) Evaluation of Gas Barrier Property (1)

In a vacuum vapor deposition apparatus, a thin film of metal Ca was formed on a glass substrate (PD200 manufactured by Asahi Glass Company, Limited) so that the thin film has a circular shape of 1 cm in diameter. The thickness of the glass substrate used was 2.8 mm. Subsequently, while the substrate was retained in the vacuum vapor deposition apparatus, a $SnO$—$SnF_2$—$P_2O_5$ film of 0.4 μm thick was formed on the metal Ca thin film, by using a $SnO$—$SnF_2$—$P_2O_5$ matrix material ($P_2O_5$: 24.4 mol %, SnO: 51.4 mol %, $SnF_2$: 24.2 mol %) in the same manner as the above (1), to obtain a glass substrate with film. At this time, the metal Ca thin film was partially masked so that $SnO$—$SnF_2$—$P_2O_5$ was not formed on the portion. Thereafter, the glass substrate with film was taken out from the vacuum vapor deposition apparatus, and left in the atmospheric air.

Figure 12:
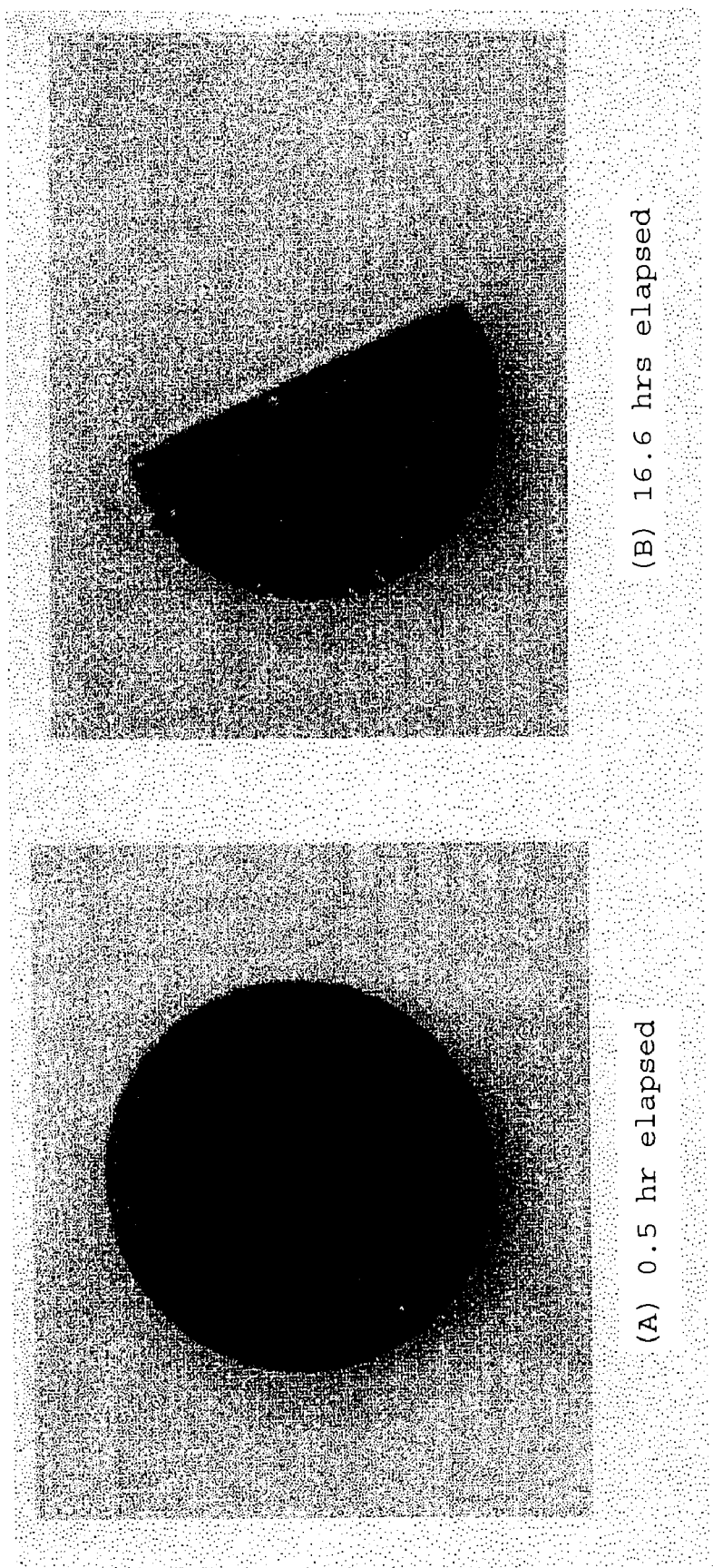
FIG. 12: A view showing evaluation result of gas barrier property of a SnO—$SnF_2$—$P_2O_5$ glass film of the present invention.

No significant change of Ca was not observed at an elapsed time of 0.5 hour (FIG. 12(A)). However, at an elapsed time of 16.6 hours, a part of the metal Ca thin film not covered with glass film (right semicircle in FIG. 12(B)) reacted with water vapor in the atmospheric air and its metallic gloss was lost. On the other hand, a portion of metal Ca thin film (left semicircle in FIG. 12(B)) covered with glass film, retained its metallic gloss even at an elapsed time of 16.6 hours (FIG. 12(B)). When the experiment is further continued, the metal Ca thin film retained its metallic gloss in the same manner as FIG. 12(B) even at an elapsed time of 2,184 hours. It is understandable from these results that a $SnO$—$SnF_2$—$P_2O_5$ glass film has excellent gas barrier property.

Here, the above method of evaluation using metal Ca thin film is described in the document mentioned in Example 3.

(5) Evaluation of Gas Barrier Property (2)

A glass substrate with film produced in the same manner as (4) was taken out from the vacuum degassing apparatus, and thereafter, it was placed still in a constant-temperature constant-humidity chamber of 60° C.90RH %, and an evaluation similar to that of (4) using metal Ca thin film was carried out.

At an elapsed time of 24 hours, a portion of the metal Ca thin film not covered with glass film, was reacted with water vapor in the atmospheric air and its metallic gloss was lost. On the other hand, a portion of the metal Ca thin film covered with glass film retained its metallic gloss even at an elapsed time of 24 hours. Here, this experiment corresponds to an accelerated experiment of the above experiment.

(6) Weather Resistance

A substrate with the formed $SnO$—$SnF_2$—$P_2O_5$ glass film was placed still in the atmospheric air, and no change of the state of glass film was observed at an elapsed time of 2,100 hours. It is understandable from this result that the formed $SnO$—$SnF_2$—$P_2O_5$ glass film has excellent weather resistance.

(7) Forming of Sealing Substrate

On the film substrate with $SnO$—$SnF_2$—$P_2O_5$ film formed in the above (1), ITO as an anode, CuPc as a hole injection layer, NPD as a hole transportation layer, Alq as a light emission layer and a magnesium layer as a cathode, are laminated in this order to form an organic EL element, and on the element, a $SnO$—$SnF_2$—$P_2O_5$ film of 0.4 μm thick was formed in the same manner as (1), to obtain a sealing substrate.

It is confirmed that the formed sealing substrate is excellent in transparency, gas barrier property and weather resistance.

Example 17

Sealing Substrate Using $SnO$—$P_2O_5$ Film (1) Forming of $SnO$—$P_2O_5$ Film

In a vacuum vapor deposition apparatus, a polycarbonate film substrate, a PET film substrate and a quartz substrate are placed as substrates (minimum visible light transmittance: polycarbonate film substrate 88%, PET film substrate 89%). The thickness of the film substrates are such that the polycarbonate film substrate: 250 μm, and the PET film substrate: 80 μm.

As a raw material to be vaporized, a $SnO$—$P_2O_5$—MgO glass matrix material ($P_2O_5$: 31.3 mol %, SnO: 63.8 mol %, MgO: 4.9 mol %) having a glass transition temperature of 310° C. and a softening temperature of 404° C., was put in a boat tray made of Ta, and electric current of 25 A was applied to the boat tray to vaporize glass components in the vacuum vapor deposition apparatus, to form a SnO—$P_2O_5$ glass film on each of the two types of film substrates. The film thicknesses of the formed $P_2O_5$ type glass films were both 0.45 μm. Further, the formed $P_2O_5$ type glass film was amorphous according to measurement by diffraction X-ray method. The softening temperature was within a range of from 100 to 800° C.

(2) Minimum Visible Light Transmittance

The transmittance of the film substrate with SnO—$P_2O_5$ film in the entire wavelength region of from 400 to 700 nm was measured in the same manner as (2) of Example 16 except that the SnO—$P_2O_5$ film formed in (1) of Example 17 was formed instead of the SnO—$SnF_2$—$P_2O_5$ film. The results are shown in FIG. 13 (polycarbonate film substrate) and FIG. 14 (PET film substrate).

Figure 13:
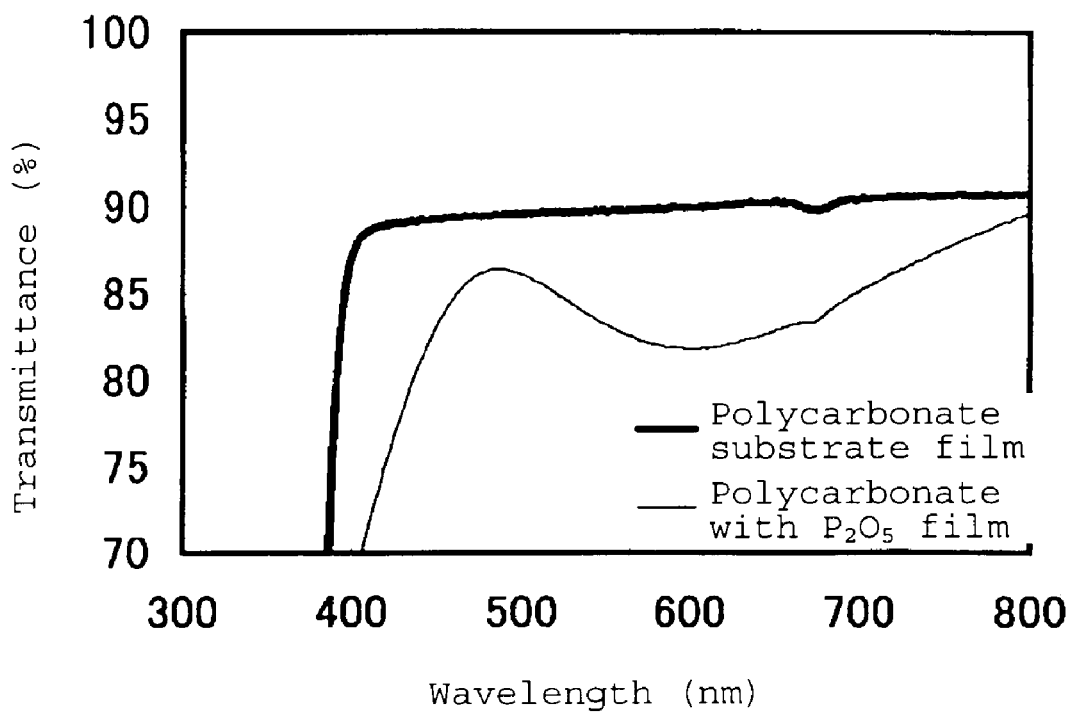
FIG. 13: A view showing the transmittance of a film substrate (polycarbonate film substrate) with SnO—$P_2O_5$ glass film of the present invention.
Figure 14:
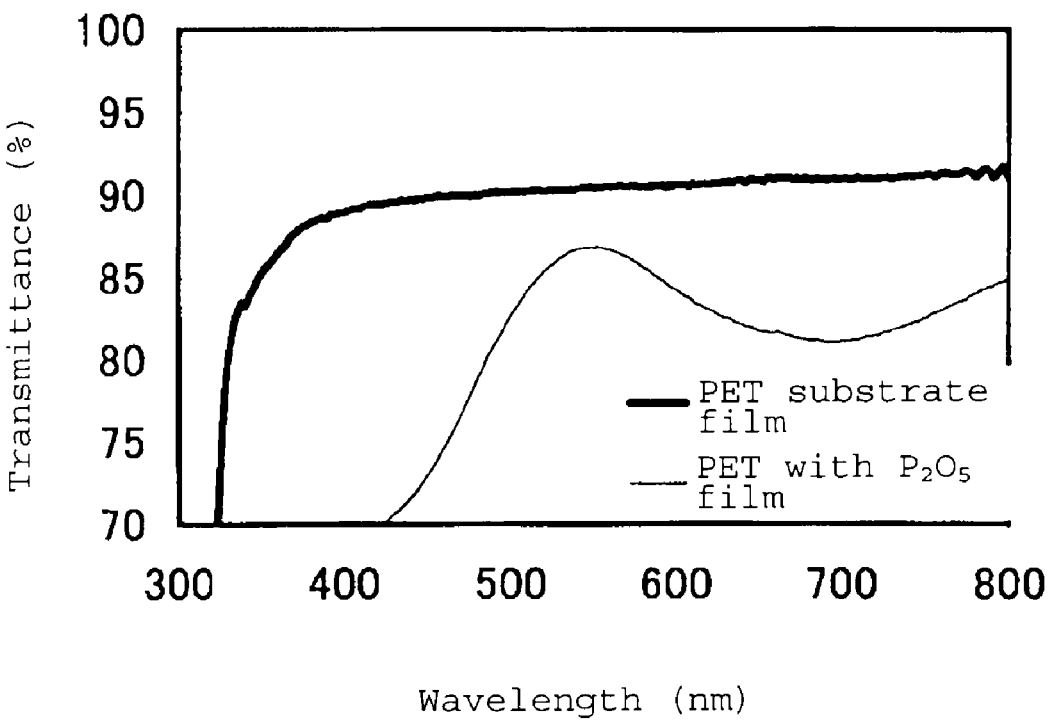
FIG. 14: A view showing the transmittance of a film (PET film) with SnO—$P_2O_5$ glass film of the present invention.

It is understandable from FIGS. 13 and 14 that the formed film substrate with SnO—$SnF_2$—$P_2O_5$ film has high transmittance of at least 65% in terms of minimum visible light transmittance in the entire wavelength region of from 400 to 700 nm, and that it is excellent in transparency.

(3) Composition Analysis

The composition of the SnO—$P_2O_5$ film was evaluated in the same manner as (3) of Example 16 except that the SnO—$P_2O_5$ film formed in (1) of Example 17 was employed instead of the SnO—$SnF_2$—$P_2O_5$ film of (3) of Example 16. As a result, the composition of the SnO—$P_2O_5$ film was such that $P_2O_5$: 44.0 mol %, SnO: 56.0 mol % and MgO: 0 mol %.

As described above, even if a film containing MgO is attempted to form by a vacuum vapor deposition method, since the vapor pressure of MgO is low, MgO is not contained in a glass film, and such a glass film is not a desirable material. On the other hand, $SnF_2$ described in Example 16 has high vapor pressure, and $SnF_2$ can be contained in the film in an amount equivalent to that in the glass matrix material as the raw material, such being preferred.

(4) Evaluation of Gas Barrier Property

Evaluation was made in the same manner as Example 16 (4). Specifically, in a vacuum vapor deposition apparatus, first of all, a thin film of metal Ca was formed on a glass substrate (manufactured by Asahi Glass Company, Limited: PD200) so that the thin film has a circular shape of 1 cm in diameter. The thickness of the glass substrate used was 2.8 mm. Then, while the substrate was left in the vacuum vapor deposition apparatus, a SnO—$P_2O_5$ film of 0.4 μm thick was formed on a metal Ca thin film by using a SnO—$P_2O_5$—MgO glass matrix material ($P_2O_5$: 31.3 mol %, SnO: 63.8 mol %, MgO: 4.9 mol %) in the same manner as (1) of the above Example 2 to obtain a glass substrate with film. At this time, the is metal Ca thin film was partially masked so that the SnO—$P_2O_5$ film was not formed on the masked portion. Thereafter, the glass substrate with film was taken out from the vacuum vapor deposition apparatus and left it in the atmospheric air.

The result was equivalent to that of Example 16. No significant change of Ca was recognized at an elapsed time of 0.5 hour, but at an elapsed time of 16.6 hours, a portion of the metal Ca thin film not covered with glass film reacted with water vapor in the atmospheric air and its metallic gloss was lost. On the other hand, a portion of the metal Ca thin film covered with SnO—$P_2O_5$ thin film retained its metallic gloss even at an elapsed time of 16.6 hours. When the experiment was continued, the metal Ca thin film portion retained its metallic gloss in the same manner as FIG. 12(B) even at an elapsed time of 2,184 hours. It is understandable from these results that the SnO—$P_2O_5$ glass film has excellent gas barrier property.

From this result, it is sufficiently presumable that in the same manner as (4) of Example 16, the SnO—$P_2O_5$ film has a water vapor permeability of $5 \times 10^{-3}$ g/m²/day or lower.

(5) Forming of Sealing Substrate

On a film substrate with the SnO—$P_2O_5$ film formed in (1) of Example 17, ITO as an anode, CuPc as a hole injection layer, NPD as a hole transportation layer, Alq is as a light emission layer, and a magnesium layer as a cathode, are laminated in this order to form an organic EL element, and on the element, a SnO—$P_2O_5$ film of 0.4 μm thick was formed in the same manner as (1) of Example 17, to obtain a sealing substrate.

The formed sealing substrate is confirmed to be excellent in transparency and gas barrier property.

INDUSTRIAL APPLICABILITY

The substrate with gas barrier film of the present invention has high gas barrier property, and thus, is useful as a substrate for displays such as liquid crystal display elements or organic ELs.

The entire disclosures of Japanese Patent Application No. 2005-244332 filed on Aug. 25, 2005 and Japanese Patent Application No. 2005-263774 filed on Sep. 12, 2005 including specifications, claims, drawings and summaries are incorporated herein by reference in their entireties.

What is claimed is:

1. A substrate with film comprising:
   a substrate; and
   a gas barrier film comprising an inorganic amorphous film and provided on at least one surface of the substrate,
   wherein the inorganic amorphous film has a softening temperature of from 100 to 800° C. and comprises a phosphate glass containing $P_2O_5$, a content of $P_2O_5$ in the phosphate glass is from 5 to 39 mol %, and the inorganic amorphous film has a film thickness of from 0.1 to 5 μm and is formed via a vapor phase.

2. A substrate with film comprising:
   a substrate; and
   a gas barrier film comprising an inorganic amorphous film provided on at least one surface of the substrate,
   wherein the inorganic amorphous film has a glass transition temperature of from 50 to 500° C. and comprises a phosphate glass containing $P_2O_5$, a content of $P_2O_5$ in the phosphate glass is from 5 to 39 mol %, and the inorganic amorphous film has a film thickness of from 0.1 to 5 μm and is formed via a vapor phase.

3. The substrate with film according to claim 1, wherein every component constituting the inorganic amorphous film has a vapor pressure of at least $1 \times 10^{-7}$ atm ($1 \times 10^{-2}$ Pa) at 1,600° C.

4. The substrate with film according to claim 2, wherein every component constituting the inorganic amorphous film has a vapor pressure of at least $1 \times 10^{-7}$ atm ($1 \times 10^{-2}$ Pa) at 1,600° C.

5. The substrate with film according to claim 1, which has a minimum transmittance of at least 65% in a wavelength region of 400 to 700 nm.

6. The substrate with film according to claim 2, which has a minimum transmittance of at least 65% in a wavelength region of 400 to 700 nm.

7. The substrate with film according to claim 1, wherein the phosphate glass further contains a fluoride.

8. The substrate with film according to claim 2, wherein the phosphate glass further contains a fluoride.

9. The substrate with film according to claim 7, wherein the content of the fluoride in the inorganic amorphous film is from 1 to 70 mol %.

10. The substrate with film according to claim 8, wherein the content of the fluoride in the inorganic amorphous film is from 1 to 70 mol %.

11. The substrate with film according to claim 7, wherein the fluoride is $SnF_2$.

12. The substrate with film according to claim 8, wherein the fluoride is $SnF_2$.

13. The substrate with film according to claim 1, wherein the phosphate glass further contains SnO.

14. The substrate with film according to claim 2, wherein the phosphate glass further contains SnO.

15. The substrate with film according to claim 13, wherein the content of the SnO in the inorganic amorphous film is from 1 to 80 mol %.

16. The substrate with film according to claim 14, wherein the content of the SnO in the inorganic amorphous film is from 1 to 80 mol %.

17. The substrate with film according to claim 1, wherein the inorganic amorphous film has a gas barrier property.

18. The substrate with film according to claim 2, wherein the inorganic amorphous film has a gas barrier property.

19. The substrate with film according to claim 1, wherein the substrate with film is a sealing substrate.

20. The substrate with film according to claim 2, wherein the substrate with film is a sealing substrate.

* * * * *